US011289564B2

United States Patent
Feng et al.

(10) Patent No.: US 11,289,564 B2
(45) Date of Patent: Mar. 29, 2022

(54) DOUBLE-SIDED DISPLAY PANEL AND METHOD FOR MANUFACTURING THE SAME

(71) Applicants: HEFEI XINSHENG OPTOELECTRONICS TECHNOLOGY CO., LTD., Hefei (CN); BOE TECHNOLOGY GROUP CO., LTD., Beijing (CN)

(72) Inventors: Xuehuan Feng, Beijing (CN); Yongqian Li, Beijing (CN)

(73) Assignees: HEFEI XINSHENG OPTOELECTRONICS TECHNOLOGY CO., LTD., Anhui (CN); BOE TECHNOLOGY GROUP CO., LTD., Beijing (CN)

( * ) Notice: Subject to any disclaimer, the term of this patent is extended or adjusted under 35 U.S.C. 154(b) by 342 days.

(21) Appl. No.: 16/475,303

(22) PCT Filed: Oct. 31, 2018

(86) PCT No.: PCT/CN2018/113044
§ 371 (c)(1),
(2) Date: Jul. 1, 2019

(87) PCT Pub. No.: WO2019/205549
PCT Pub. Date: Oct. 31, 2019

(65) Prior Publication Data
US 2021/0335960 A1    Oct. 28, 2021

(30) Foreign Application Priority Data

Apr. 23, 2018   (CN) .......................... 201810370090.1

(51) Int. Cl.
*H01L 27/32*       (2006.01)
*H01L 51/52*       (2006.01)

(52) U.S. Cl.
CPC ........ *H01L 27/3267* (2013.01); *H01L 27/322* (2013.01); *H01L 51/5271* (2013.01); *H01L 51/5284* (2013.01); *H01L 51/5203* (2013.01)

(58) Field of Classification Search
None
See application file for complete search history.

(56) References Cited

U.S. PATENT DOCUMENTS 9,173,272 B2 *  10/2015  Lee ....................... G09G 3/3225
9,224,791 B2 *  12/2015  Kim ..................... H01L 27/3272
(Continued)

FOREIGN PATENT DOCUMENTS

CN      101373576 A     2/2009
CN      102749752 A    10/2012
(Continued)

OTHER PUBLICATIONS

International Search Report and English Translation of Box V of the Written Opinion dated Feb. 12, 2019, received for corresponding PCT Application No. PCT/CN2018/113044.
(Continued)

*Primary Examiner* — Andres Munoz
(74) *Attorney, Agent, or Firm* — Kinney & Lange, P.A.

(57) ABSTRACT

A double-sided display panel and a method for manufacturing the same are provided. The double-sided display panel includes: a first substrate; a second substrate opposite to first substrate; a first display unit between the first substrate and the second substrate, the first display unit including a first luminescent layer and a first reflective layer which is closer to the second substrate than the first luminescent layer, wherein at least a part of light emitted from the first luminescent layer is reflected by the first reflective layer and emitted out through the first substrate; and a second display unit between the first substrate and second substrate, includ-
(Continued)

ing a second luminescent layer, wherein light emitted from the second luminescent layer is emitted out through the second substrate. The first display unit includes a transparent electrode and a conductive contact layer which electrically connects the transparent electrode with the first reflective layer.

20 Claims, 6 Drawing Sheets

(56) References Cited

U.S. PATENT DOCUMENTS

| | | | |
|---|---|---|---|
| 9,741,973 B2* | 8/2017 | Song | ........................ H01L 51/56 |
| 2004/0227159 A1* | 11/2004 | Nakashima | .......... G09G 3/3225 |
| | | | 257/202 |
| 2006/0066229 A1 | 3/2006 | Nimura | |
| 2012/0097928 A1* | 4/2012 | Kim | ..................... H01L 27/3267 |
| | | | 257/40 |
| 2016/0254336 A1 | 9/2016 | Zhang et al. | |

FOREIGN PATENT DOCUMENTS

| | | |
|---|---|---|
| CN | 104155791 A | 11/2014 |
| CN | 205092271 U | 3/2016 |
| CN | 107634012 A | 1/2018 |
| CN | 108400155 A | 8/2018 |
| KR | 20170059333 A | 5/2017 |

OTHER PUBLICATIONS

First Chinese Office Action dated Jun. 27, 2019, received for corresponding Chinese Application No. 201810370090.1, 29 pages.

* cited by examiner

DOUBLE-SIDED DISPLAY PANEL AND METHOD FOR MANUFACTURING THE SAME

CROSS-REFERENCE TO RELATED APPLICATION

This application is a Section 371 National Stage Application of International Application No. PCT/CN2018/113044, filed on Oct. 31, 2018, entitled "DOUBLE-SIDED DISPLAY PANEL AND METHOD FOR MANUFACTURING THE SAME", which claims the benefit of Chinese Patent Application No. 201810370090.1 filed on Apr. 23, 2018 in the State Intellectual Property Office of China, the whole disclosure of which is incorporated herein by reference.

TECHNICAL FIELD

The present disclosure relates to the field of display technologies, and in particular, to a double-sided display panel and a method for manufacturing the double-sided display panel.

BACKGROUND

At present, with the continuous development of display panels, especially an OLED display panel has become a development trend of future display panels due to its advantages such as high contrast and low power consumption.

In the field of display technologies, especially in the OLED display panel, the demand for double-sided display has become more and more urgent.

SUMMARY

In one aspect, a double-sided display panel is provided. The double-sided display panel includes: a first substrate; a second substrate opposite to the first substrate; a first display unit between the first substrate and the second substrate, the first display unit including a first luminescent layer, a first reflective layer, a transparent electrode between the first luminescent layer and the first reflective layer, and a conductive contact layer between the transparent electrode and the first reflective layer, wherein the first reflective layer is closer to the second substrate than the first luminescent layer, at least a part of light emitted from the first luminescent layer is reflected by the first reflective layer and then emitted out through the first substrate; and a second display unit between the first substrate and the second substrate, the second display unit including a second luminescent layer, wherein light emitted from the second luminescent layer is emitted out through the second substrate, wherein the conductive contact layer electrically connects the transparent electrode with the first reflective layer.

Optionally, the double-sided display panel further includes a black matrix on a side of the second substrate facing towards the first substrate.

Optionally, the transparent electrode, the conductive contact layer and the first reflective layer are sequentially disposed between the black matrix and the first luminescent layer in a direction from the first luminescent layer to the black matrix; and at least a portion of the conductive contact layer contacts the black matrix layer.

Optionally, the first display unit further includes a spacer layer, wherein the transparent electrode, the conductive contact layer, the first reflective layer and the spacer layer are sequentially disposed between the black matrix and the first luminescent layer in a direction from the first luminescent layer to the black matrix; and wherein at least a portion of the conductive contact layer contacts the black matrix.

Optionally, the black matrix comprises a light shielding region and an opening region, the first display unit is located between the light shielding region of the black matrix and the first substrate, and the second display unit is located between the opening region of the black matrix and the first substrate.

Optionally, the second display unit further includes an array circuit layer between the first substrate and the second luminescent layer, the array circuit layer being configured to control light emission of both the first display unit and the second display unit.

Optionally, the first display unit further includes a first color filter layer between the first luminescent layer and the first substrate; and/or the second display unit further includes a second color filter layer between the second luminescent layer and the second substrate.

Optionally, the second display unit further includes a second color filter layer, and the second color filter layer is located in the opening region of the black matrix.

Optionally, the first reflective layer is an auxiliary electrode metal layer made of a metal material.

Optionally, the first reflective layer includes a plurality of strips or a plurality of dots made of an opaque metal material; or the first reflective layer includes a single layer made of an opaque metal material.

Optionally, the second display unit further includes a thin film encapsulation layer or a sealant layer between the second color filter layer and the second luminescent layer.

Optionally, the conductive contact layer includes a first side portion, a second side portion and a middle portion, the first side portion and the second side portion being located on two opposite sides of the conductive contact layer, respectively, the middle portion being located between the first side portion and the second side portion; the first side portion and the second side portion both contact the black matrix, an orthographic projection of the first reflective layer on the second substrate falls within an orthographic projection of the middle portion on the second substrate, and the orthographic projection of the first reflective layer on the second substrate does not overlap with an orthographic projection of each of the first side portion and the second side portion on the second substrate; and a dimension of the middle portion in the direction from the first luminescent layer to the black matrix is less than a dimension of each of the first side portion and the second side portion in the direction from the first luminescent layer to the black matrix.

Optionally, the first reflective layer contacts a surface of the black matrix facing towards the first substrate, and an orthographic projection of the first reflective layer on the second substrate falls within an orthographic projection of the conductive contact layer on the second substrate.

Optionally, the conductive contact layer includes a first side portion, a second side portion and a middle portion, the first side portion and the second side portion being located on two opposite sides of the conductive contact layer, respectively, the middle portion being located between the first side portion and the second side portion; the first side portion and the second side portion both contact the black matrix, and the middle portion contacts the first reflective layer or the spacer layer; and a dimension of the middle portion in the direction from the first luminescent layer to the black matrix is less than a dimension of each of the first side portion and the second side portion in the direction from the first luminescent layer to the black matrix.

Optionally, the spacer layer contacts a surface of the black matrix facing towards the first substrate, and the first reflective layer is located on a surface of the spacer layer facing away from the black matrix.

Optionally, an orthographic projection of the first reflective layer on the second substrate falls within an orthographic projection of the spacer layer on the second substrate.

Optionally, the orthographic projection of each of the first reflective layer and the spacer layer on the second substrate falls within an orthographic projection of the conductive contact layer on the second substrate.

Optionally, the second display unit further includes a second reflective layer between the first substrate and the second luminescent layer.

In another aspect, a method for manufacturing a double-sided display panel is provided. The method for manufacturing the double-sided display panel includes: providing a first substrate and a second substrate which are opposite to each other; forming a first luminescent layer and a second luminescent layer between the first substrate and the second substrate, and forming a transparent electrode on a side of the first luminescent layer facing away from the first substrate; forming a first reflective layer and a conductive contact layer between the first substrate and the second substrate, wherein a first display unit and a second display unit are arranged between the first substrate and the second substrate, and the first display unit comprises the first luminescent layer, the transparent electrode, the conductive contact layer and the first reflective layer, so that at least a part of light emitted from the first luminescent layer is reflected by the first reflective layer and then emitted out through the first substrate; wherein the second display unit comprises the second luminescent layer, so that light emitted from the second luminescent layer is emitted out through the second substrate; and wherein the conductive contact layer is located between the transparent electrode and the first reflective layer so as to electrically connect the transparent electrode with the first reflective layer.

Optionally, before the step of forming the first reflective layer and the conductive contact layer between the first substrate and the second substrate, the method further includes: forming a black matrix on the second substrate.

Optionally, the step of forming the first reflective layer and the conductive contact layer between the first substrate and the second substrate includes: forming the first reflective layer on the black matrix, the first reflective layer contacting a surface of the black matrix facing away from the second substrate; and forming the conductive contact layer on a side of the first reflective layer facing away from the second substrate, the conductive contact layer covering the first reflective layer and at least a portion of the conductive contact layer contacting the black matrix.

Optionally, the method further includes: forming a spacer layer on the black matrix, the spacer layer contacting a surface of the black matrix facing away from the second substrate, wherein the step of forming the first reflective layer and the conductive contact layer between the first substrate and the second substrate includes: forming the first reflective layer on a surface of the spacer layer facing away from the black matrix; and forming the conductive contact layer on a side of the first reflective layer facing away from the second substrate, the conductive contact layer covering both the first reflective layer and the spacer layer and at least a portion of the conductive contact layer contacting the black matrix.

BRIEF DESCRIPTION OF THE DRAWINGS

In order to more clearly illustrate technical schemes of embodiments of the present disclosure, accompanying drawings of the embodiments will be briefly described below, and it should be understood that the drawings described below refer only to some embodiments of the present disclosure, rather than to limit the present disclosure.

DETAILED DESCRIPTION OF EMBODIMENTS

Figure 1A:
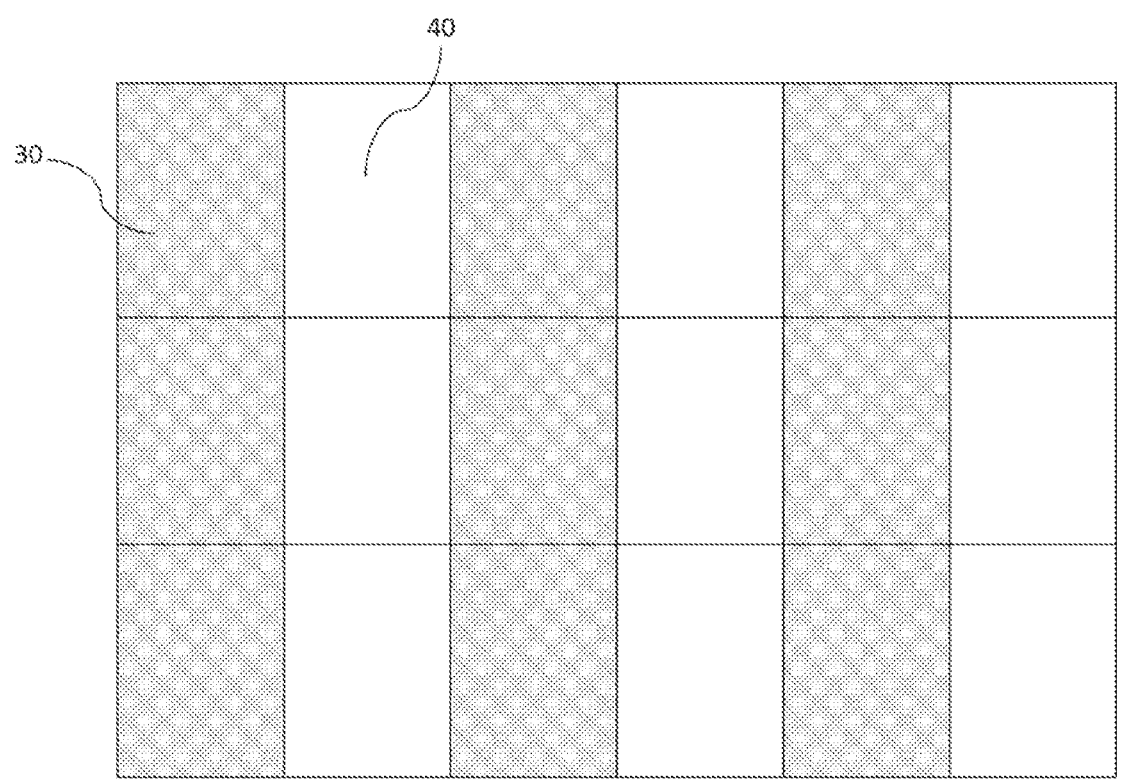
FIG. 1A illustrates a schematic view of a pixel structure of an OLED double-sided display panel according to some embodiments of the present disclosure.

In order to explain objectives, technical schemes, and advantages more clearly, embodiments of the present disclosure will be described in detail below with reference to accompanying drawings. It is to be understood that the following description of the embodiments is intended to explain and illustrate a general concept of the present disclosure, rather than to be construed as limiting the present disclosure. Throughout the specification and the drawings, the same or similar reference numerals are intended to refer to the same or similar components or parts. For the sake of clarity, the drawings are not necessarily drawn to scale, and some of well-known components and structures may be omitted in the drawings.

Unless otherwise defined, technical terms or scientific terms used in the present disclosure are intended to be understood in the ordinary meaning of the ordinary skill of the art. The words such as "first" "second" and the like used in the present disclosure do not denote any order, quantity, or importance, but are used to distinguish different components. The word "a" or "an" does not exclude a plurality. The word "comprising", "comprise", "including", "include" or the like means that the element or item preceding the word comprises or includes the elements, items or equivalents thereof listed following the word, without excluding other elements or items. The word "connected", "connecting" or the like is not limited to physical or mechanical connection, but may include electrical connection, regardless of direct or indirect connection. The words "up", "lower", "left", "right", "top" or "bottom" and the like are only used to indicate the relative positional relationship, and the relative positional relationship may be change accordingly when an absolute position of the described object is changed. When an element such as a layer, a film, a region, or a substrate is referred to as being "on" or "under" another element, the element may be "directly on" or "directly under" another element, or there may be intermediate elements therebetween.

FIG. 1A is a schematic view of a pixel structure of an OLED double-sided display panel according to some embodiments of the present disclosure. Nine display pixels are shown in FIG. 1A, each display pixel including two adjacent display units, namely a first display unit 30 and a second display unit 40. It is to be understood that the structure shown in FIG. 1A is merely exemplary. The OLED double-sided display panel may further include other numbers of display pixels, and each display pixel may also include other numbers of display units than two, for example, multiple display units in two adjacent columns or in two adjacent rows. In other words, the present disclosure is not intended to limit distributions of both the display pixels and the display units of the OLED double-sided display panel. The first display unit 30 and the second display unit 40 are shown in different hatch patterns in FIG. 1A for differentiation.

Figure 1B:
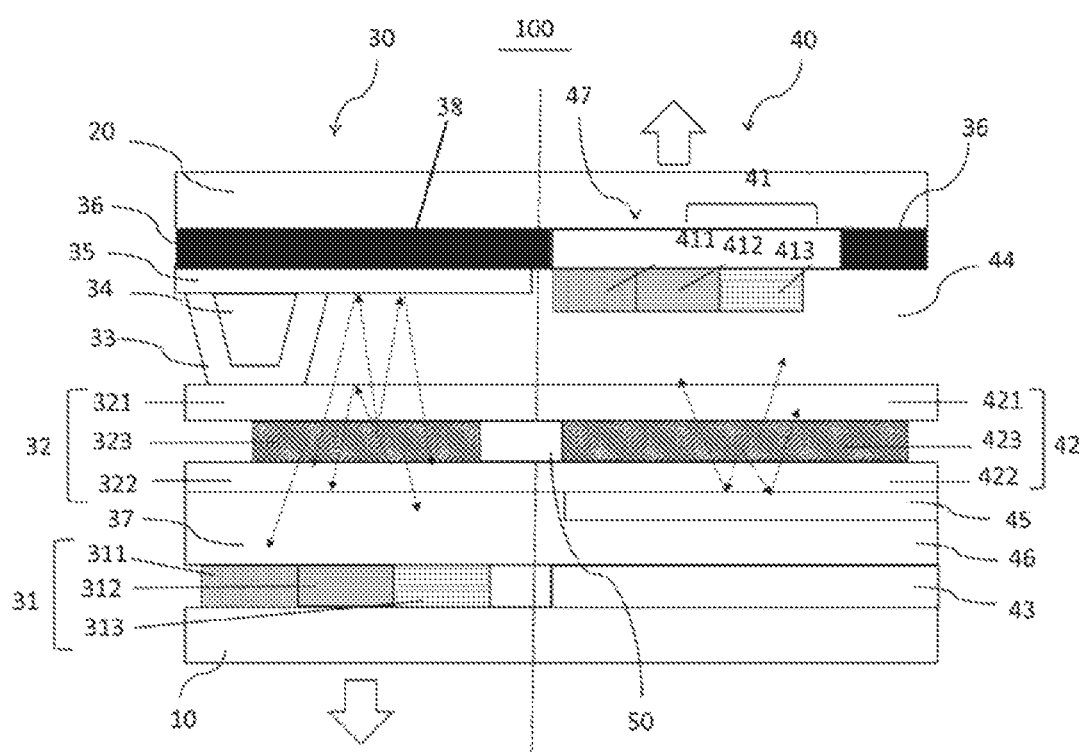
FIG. 1B illustrates a structural cross-sectional view of an OLED double-sided display panel according to some embodiments of the present disclosure.

FIG. 1B is a structural cross-sectional view of an OLED double-sided display panel according to some embodiments of the present disclosure. The OLED double-sided display panel 100 includes a first substrate 10 and a second substrate 20 which are disposed opposite to each other, and a first display unit 30 and a second display unit 40, which are both located between the first substrate 10 and the second substrate 20. In some embodiments of the present disclosure, in order to realize double-sided display, the first substrate 10 and the second substrate 20 are both disposed as substrates capable of transmitting light, such as glass substrates.

In some embodiments, a black matrix 36 is disposed between the first substrate 10 and the second substrate 20, for example, the black matrix 36 is disposed on a side near the second substrate 20 between the first substrate 10 and the second substrate 20. The black matrix 36 includes a light shielding region 38 and an opening region 47, and the first display unit 30 is located between the light shielding region 38 of the black matrix 36 and the first substrate 10. However, such a positional relationship is not absolute, and for example, a majority of the first display unit 30 may be located between the light shielding region 38 of the black matrix 36 and the first substrate 10. The first display unit 30 includes a first OLED luminescent layer 323 and a first reflective layer 35. The first reflective layer 35 is disposed closer to the light shielding region 38 of the black matrix 36 than the first OLED luminescent layer 323. Light emitted from the first OLED luminescent layer 323 is reflected by the first reflective layer 35 and then emitted out through the first substrate 10. In the embodiments, the black matrix 36 is directly disposed on the second substrate 20, and the first reflective layer 35 is directly disposed on the light shielding region 38 of the black matrix 36.

In some embodiments, the second display unit 40 is located between the first substrate 10 and the opening region 47 of the black matrix 36. However, such a positional relationship is not absolute, and for example, a majority of the second display unit 40 may be located between the first substrate 10 and the opening region 47 of the black matrix 36. The second display unit 40 includes a second OLED luminescent layer 423. Light emitted from the second OLED luminescent layer 423 passes through the opening region 47 of the black matrix 36 and is emitted out through the second substrate 20.

With the above-described structural arrangement, the first display unit 30 and the second display unit 40 emit light respectively through the first substrate 10 and the second substrate 20, thus the OLED double-sided display panel of the present disclosure may realize double-sided display. In the foregoing embodiments, the black matrix 36 is disposed on a side of the second substrate 20 facing towards the first substrate 10, and the first display unit 30 is disposed between the light shielding region 38 of the black matrix 36 and the first substrate 10, so that the light emitted from the first OLED luminescent layer 323 is blocked and reflected by the first reflective layer 35. In this way, the light emitted from the first OLED luminescent layer 323 may be emitted out through the first substrate 10, rather than the second substrate 20. The second display unit 40 is disposed between the opening region 47 of the black matrix 36 and the first substrate 10, so that the light emitted from the second OLED luminescent layer 423 is not blocked by the black matrix 36 and may be directly emitted out through the second substrate 20. Thereby, the first display unit 30 and the second display unit 40 may emit light through the first substrate 10 and the second substrate 20, respectively.

Alternatively, the black matrix 36 may not be disposed between the first substrate 10 and the second substrate 20 as long as the light emitted from the first display unit 30 and the light emitted from the second display unit 40 can be emitted out through the first substrate 10 and the second substrate, respectively.

As shown in FIG. 1B, one first display unit 30 and one second display unit 40 are disposed adjacent to each other, for example, they may be disposed adjacent to each other in the same one row or in the same one column, or they may be respectively disposed in two adjacent rows or two adjacent columns. In some embodiments, the first display unit 30 and the second display unit 40 may be disposed in two rows or two columns that are not adjacent to each other, respectively. It is to be understood that specific positions of the first display unit 30 and the second display unit 40 may be appropriately set by those skilled in the art as needed and are not limited to specific examples described in the present disclosure.

Although only one first display unit 30 and only one second display unit 40 are shown, it is to be understood that the OLED double-sided display panel of the present disclosure may further include more first display units 30 and more second display units 40. The first display units 30 and the second display units 40 are not necessarily arranged to be adjacent to one another, and they may be arranged in any form by those skilled in the art as needed, for example, they may be arranged in a matrix or in any preset pattern.

In order to enable double-sided display, it is required to enable the light to be emitted out through double sides of the OLED double-sided display panel 100. The double sides described herein refer to a side on which the first substrate 10 of the OLED double-sided display panel 100 is located and the other side on which the second substrate 20 is located. Also, the double sides may be referred to as front side and back side. It should be noted that the first substrate 10, the second substrate 20, the front side and the back side described herein are not intended to limit the present disclosure, only to distinguish them in the description, so that those skilled in the art can understand the concept of the present disclosure more clearly. In other words, the first substrate 10, the second substrate 20, the front side and the back side may be replaced with one another as needed.

Hereinafter, the embodiments of the present disclosure will be described by taking the first display unit 30 and the second display unit 40 which are arranged in the same row or in the same column and adjacent to each other as an example. The first display unit 30 and the second display unit 40 adjacent to each other are spaced apart by a pixel defining layer 50. It is to be understood that each of the first display unit 30 and the second display unit 40 described in the present disclosure may be one pixel, for example, including three sub-pixels of red sub-pixel, green sub-pixel and blue sub-pixel (RGB); of course, each of them may also be one sub-pixel.

The first display unit 30 includes a first color filter layer 31, a first OLED element layer 32, a conductive contact layer 33, a spacer layer 34, and a first reflective layer 35, which are sequentially disposed between the first substrate 10 and the second substrate 20 in a direction from the first substrate 10 to the second substrate 20. Specifically, the first color filter layer 31 is directly on the first substrate 10 and includes a red filter layer 311, a green filter layer 312, and a blue filter layer 313. The first OLED element layer 32 is located on the first color filter layer 31. In some embodiments, the first display unit 30 further includes a first planarization layer 37 between the first OLED element layer 32 and the first color filter layer 31.

The first OLED element layer 32 includes a transparent cathode 321, a transparent anode 322, and a first OLED luminescent layer 323 between the transparent cathode 321 and the transparent anode 322. The transparent anode 322 is located on the first planarization layer 37 or on the first color filter layer 31. One side of the conductive contact layer 33 contacts the transparent cathode 321 and another side thereof contacts the first reflective layer 35. In some embodiments, the transparent cathode 321 and the conductive contact layer 33 are both made of transparent conductive materials such as indium tin oxide material (ITO), and they may be formed through the same process or different processes. For example, the transparent cathode 321 and the conductive contact layer 33 may be formed through different processes and then pressed together through a pressing process. As a result, the transparent cathode 321 and the first reflective layer 35 may be electrically connected together through the conductive contact layer 33.

In some embodiments, a black matrix 36 is directly disposed on a surface of the second substrate 20 facing towards the first substrate 10, and the black matrix 36 includes a light shielding region 38 and an opening region 47. The first reflective layer 35 is disposed on the light shielding region 38 of the black matrix 36. The spacer layer 34 is disposed on a portion of the first reflective layer 35, and the conductive contact layer 33 at least partially covers the spacer layer 34. In the illustrated embodiment, the conductive contact layer 33 completely covers the spacer layer 34 and a portion thereof contacts a surface of the first reflective layer 35, that is, the spacer layer 34 is located between the conductive contact layer 33 and a portion of the first reflective layer 35. In some embodiments, an orthographic projection of the spacer layer 34 on the first reflective layer 35 falls within an orthographic projection of the conductive contact layer 33 on the first reflective layer 35.

In some embodiments, the first reflective layer 35 is made of a metal material. Thus, the first reflective layer 35 is also referred to as an auxiliary cathode metal layer. In some examples, the first reflective layer 35 includes a plurality of strips or a plurality of dots made of an opaque metal material; or the first reflective layer 35 includes a single layer made of an opaque metal material.

In the illustrated embodiment, light which is emitted from the first OLED element layer 32 and propagates downwardly is directly emitted out through the first substrate 10, while a part of light which is emitted from the first OLED element layer 32 and propagates upwardly is reflected by the transparent cathode 321 and another portion of the light is reflected by the first reflective layer 35. In this way, the light reflected by the first reflective layer 35 sequentially passes through the conductive contact layer 33, the first OLED element layer 32, the first planarization layer 37, the first color filter layer 31, and then is emitted out through the first substrate 10 (as indicated by solid arrows in the drawings). Accordingly, the light reflected by the transparent cathode 321 sequentially passes through the first planarization layer 37, the first color filter layer 31, and then is emitted out through the first substrate 10 (as indicated by solid arrows in the drawings). As a result, the user can observe a displayed image from an outer side or a front side of the first substrate 10. In some embodiments, the display unit or the luminescent region in such a form may be referred to as a bottom emission region as the light is firstly emitted upwardly and is ultimately emitted out downwardly through the display panel.

The second display unit 40 includes a second color filter layer 41, a second OLED element layer 42, a second reflective layer 45, and an array circuit layer 43, which are sequentially disposed between the first substrate 10 and the second substrate 20 in a direction from the second substrate 20 to the first substrate 10. The second color filter layer 41 is disposed on a side of the opening region 47 of the black matrix 36 close to the first substrate 10, and includes a red filter layer 411, a green filter layer 412, and a blue filter layer 413, referring to FIG. 1B.

Figure 1C:
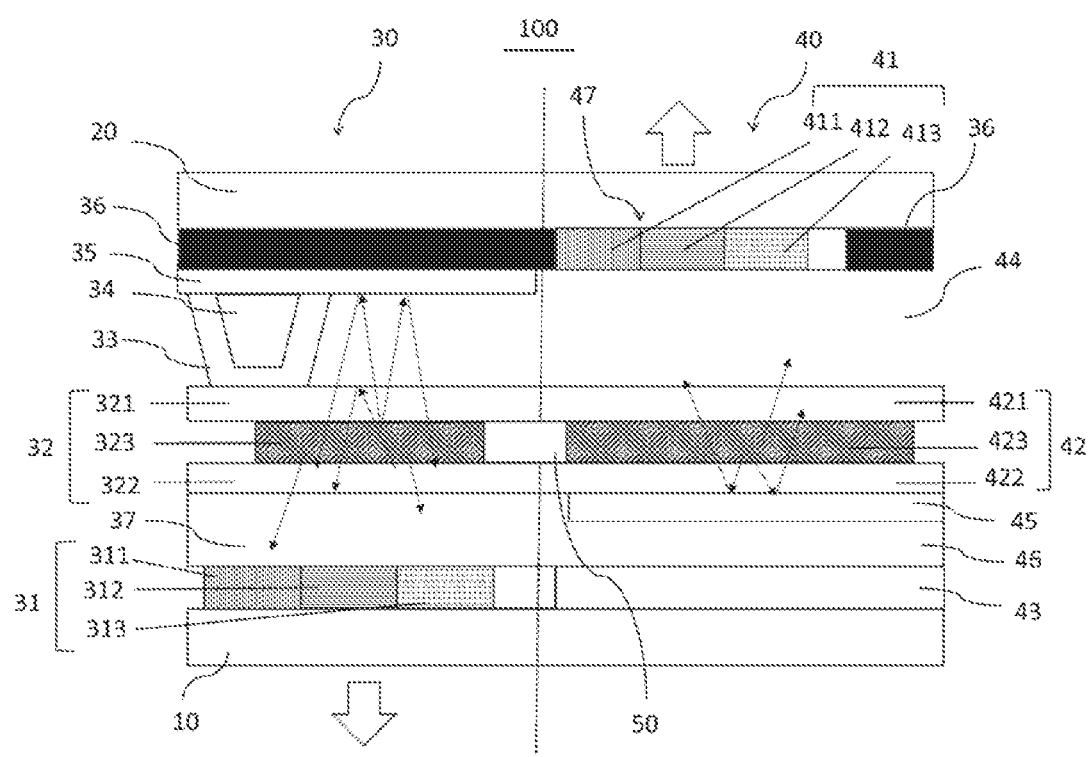
FIG. 1C illustrates a structural cross-sectional view of an OLED double-sided display panel according to some embodiments of the present disclosure.

Optionally, the second color filter layer 41 is disposed in the opening region 47 of the black matrix 36, that is, the second color filter layer 41 is disposed on a surface of the second substrate 20 facing towards the first substrate 10 and corresponds to the opening region 47, and the second color filter layer 41 includes a red filter layer 411, a green filter layer 412 and a blue filter layer 413, referring to FIG. 1C. In this case, the second display unit 40 is directly located between the first substrate 10 and the second substrate 20.

In some embodiments, a sealant layer 44 is further disposed between the second color filter layer 41 and the second OLED element layer 42. For example, the sealant layer 44 may be made of a transparent dry encapsulant.

In some embodiments, the second reflective layer 45 between the second OLED element layer 42 and the array circuit layer 43 is made of an opaque metal material. In some examples, the second reflective layer 45 acts as a reflective metal anode to at least reflect a part of light emitted from the second OLED element layer 42. The second display unit 40 may further include a second planarization layer 46 disposed between the second reflective layer 45 and the array circuit layer 43.

The second OLED element layer 42 includes a transparent cathode 421, a transparent anode 422, and a second OLED luminescent layer 423 between the transparent cathode 421 and the transparent anode 422. The transparent anode 422 is located on the second reflective layer 45, and the transparent cathode 421 is in contact with the sealant layer 44. The second reflective layer 45 may be provided in the same form as the first reflective layer 35, for example, including a plurality of strips, a plurality of dots, or a single layer. In the following embodiments, the second reflective layer 45 may be provided in the same way, and therefore will not be described in detail again.

Thus, as indicated by solid arrows in the drawings, light which is emitted from the second OLED element layer 42 and propagates upwardly is directly incident on the second color filter layer 41 and emitted out through the second substrate 20 while light which is emitted from the second OLED element layer 42 and propagates downwardly is reflected by the second reflective layer 45 towards the second substrate 20 to be emitted out through the second substrate 20. As a result, the user can observe a displayed image from an outer side or a back side of the second substrate 20. As described above, the display unit or the luminescent region in such a form may be referred to as a top emission region as the light propagates upwardly to be directly emitted out through the display panel.

It should be noted that the array circuit layer 43 may be configured to control light emission of both the first display unit 30 and the second display unit 40, and may include various semiconductor elements, such as thin film transistors, so as to enable the first display units 30 and the second display unit 40 adjacent to each other simultaneously display the same image on both the front side and the back side of the OLED double-sided display panel. Of course, those skilled in the art may also set the array circuit layer 43 as needed so that different images are respectively displayed on the front side and the back side of the OLED double-sided display panel.

However, on one hand, since the spacer layer 34 and the conductive contact layer 33 which are stacked together are disposed between the first reflective layer 35 and the transparent cathode 321 in the first display unit 30, the first reflective layer 35 is distant from the first OLED luminescent layer 323, so that the light emitted from the first OLED element layer 32 is required to propagate long distance to be reflected. As a result, a luminous intensity of a region of the first display unit 30 is reduced. On the other hand, a majority of the light emitted from the second OLED element layer 42 in the second display unit 40 is directly emitted out through the second substrate 20 without the reflection. Also, since the second reflective layer 45 is near the second OLED luminescent layer 423, so that the light which is emitted from the second OLED luminescent layer 423 and reflected by the second reflective layer 45 propagates short distance. As a result, a luminous intensity of the second display unit 40 is high. Thus, the luminous intensity of the first display unit 30 is significantly lower than the luminous intensity of the second display unit 40. In other words, the luminous intensity of the bottom emission region is relatively low.

In addition, since the spacer layer 34 and the conductive contact layer 33 are stacked on each other, the cell gap of the OLED double-sided display panel is increased to some extent.

In order to at least partially enhance the luminous intensity of the first display unit 30 and/or reduce the cell gap of the OLED double-sided display panel, some embodiments of the present disclosure provide an OLED double-sided display panel.

Figure 2:
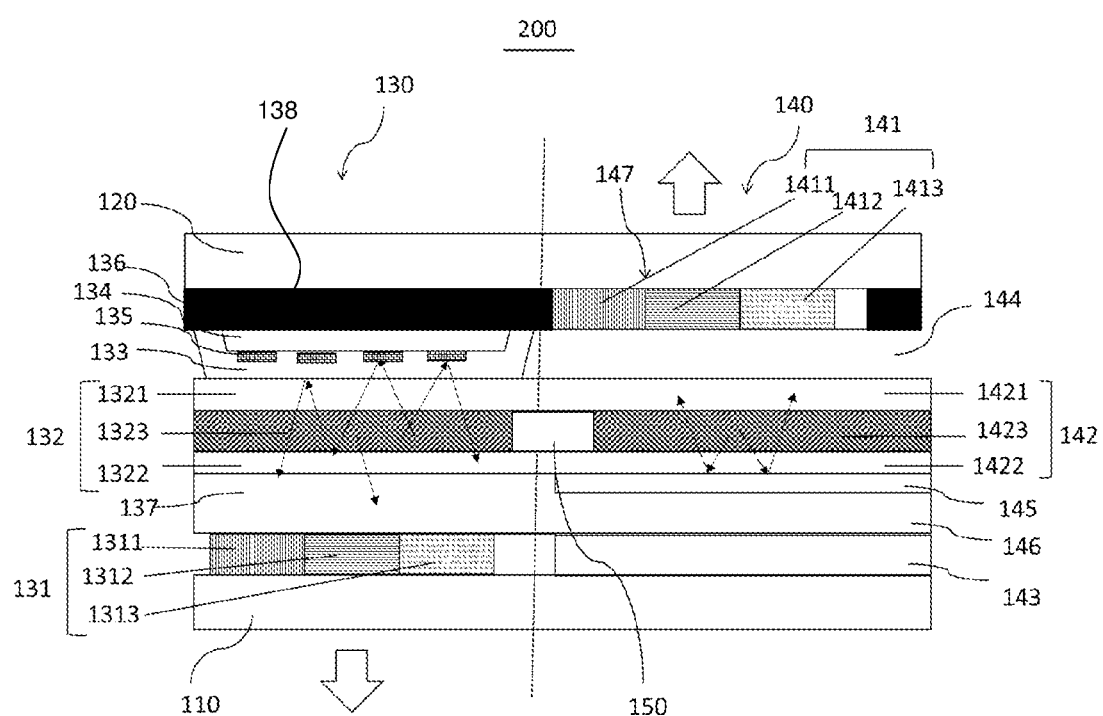
FIG. 2 illustrates a structural cross-sectional view of an OLED double-sided display panel according to some embodiments of the present disclosure.

FIG. 2 shows a schematic structural view of an OLED double-sided display panel 200 according to some embodiments of the present disclosure. The OLED double-sided display panel 200 includes a first substrate 110 and a second substrate 120 disposed opposite to each other, and the OLED double-sided display panel 200 further includes a first display unit 130 and a second display unit 140 which are both located between the first substrate 110 and the second substrate 120. The first display unit 130 and second display unit 140 are adjacent to each other and spaced apart by a pixel defining layer 150.

In some embodiments, a black matrix 136 is disposed between the first substrate 110 and the second substrate 120, for example, the black matrix 136 is disposed on a side near the second substrate 120 between the first substrate 110 and the second substrate 120. The black matrix 136 includes a light shielding region 138 and an opening region 147. In some embodiments, the first display unit 130 includes a first OLED luminescent layer 1323 and a first reflective layer 135. The first reflective layer 135 is disposed closer to the black matrix 136 than the first OLED luminescent layer 1323. Light emitted from the first OLED luminescent layer 1323 is reflected by the first reflective layer 135 so as to be emitted out through the first substrate 110. In the embodiments, the black matrix 136 is directly disposed on a surface of the second substrate 20, the spacer layer 134 is disposed on the black matrix 136, and the first reflective layer 135 is disposed on the spacer layer 134.

In some embodiments, the second display unit 140 is located between the first substrate 110 and the second substrate 120. The second display unit 140 includes a second OLED luminescent layer 1423. Light emitted from the second OLED luminescent layer 1423 passes through the opening region 147 of the black matrix 136 and then is emitted out through the second substrate 120.

As described above, as an example, only one first display unit 130 and one second display unit 140 are shown here.

Specifically, the first display unit 130 includes a first color filter layer 131, a first OLED luminescent element 132, a conductive contact layer 133, a first reflective layer 135, and a spacer layer 134, which are sequentially disposed between the first substrate 110 and the second substrate 120 in a direction from the first substrate 110 to the second substrate 120. Light which is emitted from a first OLED luminescent layer 1323 and propagates upwardly is reflected by the first reflective layer 135 or by a transparent cathode 1321 towards the first substrate 110. The light reflected by the first reflective layer 135 sequentially passes through the conductive contact layer 133, the first OLED luminescent element 132 and the first color filter layer 131 and then is emitted out through the first substrate 110, as indicated by solid arrows in the drawings, in which only partially reflected light is schematically shown. The light reflected by the transparent cathode 1321 sequentially passes through the first OLED luminescent element 132 and the first color filter layer 131, and then is emitted out through the first substrate 110. Light which is emitted from the first OLED luminescent layer 1323 and propagates downwardly passes through the first color filter layer 131 directly and is emitted out through the first substrate 110.

In the embodiments, the spacer layer 134 is directly disposed on the light shielding region 138 of the black matrix 136, the first reflective layer 135 is located on the spacer layer 134, and the conductive contact layer 133 covers the spacer layer 134 on which the first reflective layer 135 is stacked. In other words, at least a portion (both sides in the drawing) of the conductive contact layer 133 is in contact with the black matrix 136 (specifically, the light-shielding region 138 of the black matrix 136). In the embodiment shown in FIG. 2, an orthographic projection of the first reflective layer 135 on the second substrate 120 falls within an orthographic projection of the spacer layer 134 on the second substrate 120, so that the spacer layer 134 has a relatively large surface area. Thus, it is possible to make a thin spacer layer 134.

In other words, in the case of such a structural arrangement, in comparison with the OLED double-sided display panel 100 as shown in FIG. 1B and FIG. 1C, at least since the spacer layer 134 has a relatively large surface area, the spacer layer 134 may be made relatively thin, the cell gap of the illustrated OLED double-sided display panel 200 is reduced, and/or the aperture ratio of the illustrated OLED double-sided display panel 200 is increased.

In addition, since the cell cap is reduced, a distance between the first reflective 135 and the first OLED luminescent layer 1323 is reduced, so that an optical path of the light reflected by the first reflective layer 135 in the first display unit 30 is also reduced, so that a luminous efficiency of the first display unit 30 is increased.

In the embodiment shown in FIG. 2, the first reflective layer 135 is disposed between the spacer layer 134 and the conductive contact layer 133, and the orthographic projection of the first reflective layer 135 on the second substrate 120 falls within an orthographic projection of the conductive contact layer 133 on the second substrate 120, so as to form a structure in which the conductive contact layer 133 surrounds the first reflective layer 135. With such a structure, at least one or a part of the following effects may be achieved: the first reflective layer 135 may function as a reflective electrode for the first OLED element layer 132, so that a luminous efficiency of the first OLED luminescent layer 1323 or the first luminescent unit is improved; further in the first display unit 130, the conductive contact layer 133 is substantially in contact with an entire surface of the transparent cathode 1321, so that not only a resistance voltage drop is reduced, but also a contact interface between the conductive contact layer 133 and the transparent cathode 1321 may increase the reflection effect at least to some extent. For these reasons, a thickness of the transparent cathode 1321 may be at least partially reduced without increasing the resistance voltage drop.

Figure 4:
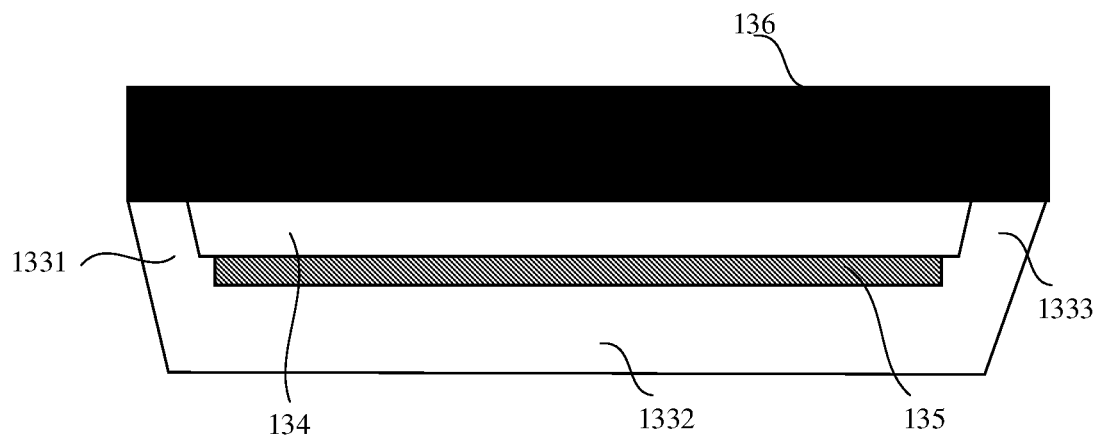
FIG. 4 is a partial enlarged view of an OLED double-sided display panel according to some embodiments of the present disclosure, in which positional relationships among a conductive contact layer, a first reflective layer, a spacer layer and a black matrix are shown.

It should be noted that the first reflective layer 135 includes a plurality of strips, a plurality of dots or an entire layer, which is made of a metal material. Of course, the present disclosure does not limit the shape of the first reflective layer 135 as long as the light emitted from the first OLED element layer 132 may be reflected by the first reflective layer 135. For example, as shown in FIG. 2, the first reflective layer 135 includes a plurality of strips made of an opaque metal material; as shown in FIG. 4, the first reflective layer 135 includes a single layer made of an opaque metal material.

Specifically, the first color filter layer 131 is directly disposed on the first substrate 10 and includes a red filter layer 1311, a green filter layer 1312, and a blue filter layer 1313. The first OLED element layer 132 is located on the first color filter layer 131. In some embodiments, the first display unit 130 further includes a first planarization layer 137 between the first OLED element layer 132 and the first color filter layer 131.

The first OLED element layer 132 includes a transparent cathode 1321, a transparent anode 1322, and a first OLED luminescent layer 1323 between the transparent cathode 1321 and the transparent anode 1322. The transparent anode 1322 is located on the first planarization layer 137 or on the first color filter layer 131, one side of the conductive contact layer 133 contacts the transparent cathode 1321, and another side of the conductive contact layer 133 contacts the black matrix 136. In some embodiments, the transparent cathode 1321 and the conductive contact layer 133 are both made of transparent conductive materials such as indium tin oxide material (ITO), and they may be formed through the same process or through different processes. For example, the transparent cathode 1321 and the conductive contact layer 133 may be formed through different processes and then pressed together through a pressing process. As a result, the transparent cathode 1321 and the first reflective layer 135 may be electrically connected together through the conductive contact layer 133.

The black matrix 136 is directly disposed on a surface of the second substrate 120 facing towards the first substrate 110, and the black matrix 136 includes a light shielding region 138 and an opening region 147. The spacer layer 134 is disposed on the light shielding region 138 of the black matrix 136, and the first reflective layer 135 is disposed on the spacer layer 134. The first reflective layer 135 is disposed on a surface of the spacer layer 134 facing towards the first substrate 110. The conductive contact layer 133 on the first reflective layer 135 at least partially covers the spacer layer 134. In the illustrated example, the conductive contact layer 133 completely covers the spacer layer 134, that is, an orthographic projection of the spacer layer 134 on the second substrate 120 falls within an orthographic projection of the conductive contact layer 133 on the second substrate 120. In some embodiments, an orthographic projection of the spacer layer 134 on the black matrix 136 is slightly less than an orthographic projection of the conductive contact layer 133 on the black matrix 136.

In some embodiments, the first reflective layer 135 is made of an opaque metal material. Thus, the first reflective layer 135 is also referred to as an auxiliary cathode metal layer. In the illustrated embodiment, a portion of the light emitted from the first OLED element layer 132 is reflected by the transparent cathode 1321 while another portion of the light is reflected by the first reflective layer 135 towards the first substrate 110. In this way, the light reflected by the first reflective layer 135 passes through the conductive contact layer 133, the first OLED element layer 132, the first planarization layer 137, the first color filter layer 131, and then is emitted out through the first substrate 110. As a result, the user can observe a displayed image from the outer side or the front side of the first substrate 110.

In some embodiments, referring to FIG. 2 and FIG. 4, the conductive contact layer 133 includes a first side portion 1331, a second side portion 1333 and a middle portion 1332, the first side portion 1331 and the second side portion 1333 are located on two opposite sides of the conductive contact layer 133, respectively, and the middle portion 1332 is located between the first side portion 1331 and the second side portion 1333. For example, in the embodiment shown in FIG. 4, the conductive contact layer 133 has substantially a "U"-shape cross section. The first reflective layer 135 and the spacer layer 134 are both located in a space formed between the conductive contact layer 133 and the black matrix 136. The first side portion 1331 and the second side portion 1333 both contact the black matrix 136, and the middle portion 1332 contacts the first reflective layer 135 or the spacer layer 134. An orthographic projection of the first reflective layer 135 on the second substrate 120 falls within an orthographic projection of the middle portion 1332 on the second substrate 120, and the orthographic projection of the first reflective layer 135 on the second substrate 120 does not overlap with an orthographic projection of each of the first side portion 1331 and the second side portion 1333 on the second substrate 120. Further, a dimension of the middle portion 1332 in the direction from the first luminescent layer 1323 to the black matrix 136 (the dimension is a thickness of the middle portion 1332 according to an orientation in FIG. 2 or FIG. 4) is less than a dimension of each of the first side portion 1331 and the second side portion 1333 in the direction from the first luminescent layer 1323 to the black matrix 136 (the dimension is a thickness of the first side portion 1331 or the second side portion 1333 according to the orientation in FIG. 2 or FIG. 4).

The second display unit 140 includes a second color filter layer 141, a second OLED element layer 142, a second reflective layer 145, and an array circuit layer 143, which are sequentially disposed between the first substrate 110 and the second substrate 120 in a direction from the second substrate 120 to the first substrate 110. For example, the second color filter layer 141 is disposed on a surface of the second substrate 120 facing towards the first substrate 110 and may be disposed in the opening region 147 of the black matrix 136, and includes a red filter layer 1411, a green filter layer 1412, and a blue filter layer 1413.

In some embodiments, a sealant layer 144 is further disposed between the second color filter layer 141 and the second OLED element layer 142. For example, the sealant layer 144 may be made of a transparent dry encapsulant.

In some embodiments, the second reflective layer 145 between the second OLED element layer 142 and the array circuit layer 143 is made of an opaque metal material, and the second reflective layer 145 may have the same or similar structure or shape as the first reflective layer 135. In some examples, the second reflective layer 145 functions as a metal reflective anode so as to at least partially reflect light emitted from the second OLED element layer 142. The second display unit 40 may further include a second planarization layer 146 which is disposed between the second reflective layer 145 and the array circuit layer 143.

The second OLED element layer 142 includes a transparent cathode 1421, a transparent anode 1422, and a second OLED luminescent layer 1423 between the transparent cathode 1421 and the transparent anode 1422. The transparent anode 1422 is located on the second reflective layer 145, and the transparent cathode 1421 is in contact with the sealant layer 144.

Thus, as indicated by arrows in the drawings, light which is emitted from the second OLED element layer 142 and propagates upwardly is emitted towards the second color filter layer 141 and emitted out through the second substrate 120 while light which is emitted from the second OLED element layer 142 and propagates downwardly is reflected by the second reflective layer 145 to be emitted out through the second substrate 120. As a result, the user can observe a displayed image from an outer side or a back side of the second substrate 120.

It should be noted that the array circuit layer 143 may be configured to control the light emission of both the first display unit 130 and the second display unit 140, and may include various semiconductor elements, such as thin film transistors, so as to enable the first display units 30 and the second display unit 40 adjacent to each other simultaneously display the same image on both the front side and the back side of the OLED double-sided display panel. Of course, those skilled in the art may also set the array circuit layer 43 as needed so that different images are respectively displayed on the front side and the back side of the OLED double-sided display panel.

For example, the transparent cathode 1421, the second OLED luminescent layer 1423 and the transparent anode 1422 of the second OLED element layer 142 may be located in the same layer as the transparent cathode 1321, the first OLED luminescent layer 1323 and the transparent anode 1322 of the first OLED element layer 132, respectively. In other words, the transparent cathode 1421 may be made of the same material and formed through the same patterning process as the transparent cathode 1321, the second OLED luminescent layer 1423 may be made of the same material and formed through the same patterning process as the first OLED luminescent layer 1323, and the transparent anode 1422 may be made of the same material and formed through the same patterning process as the transparent anode 1322, In this way, a process for manufacturing the double-sided display panel may be simplified.

Figure 3:
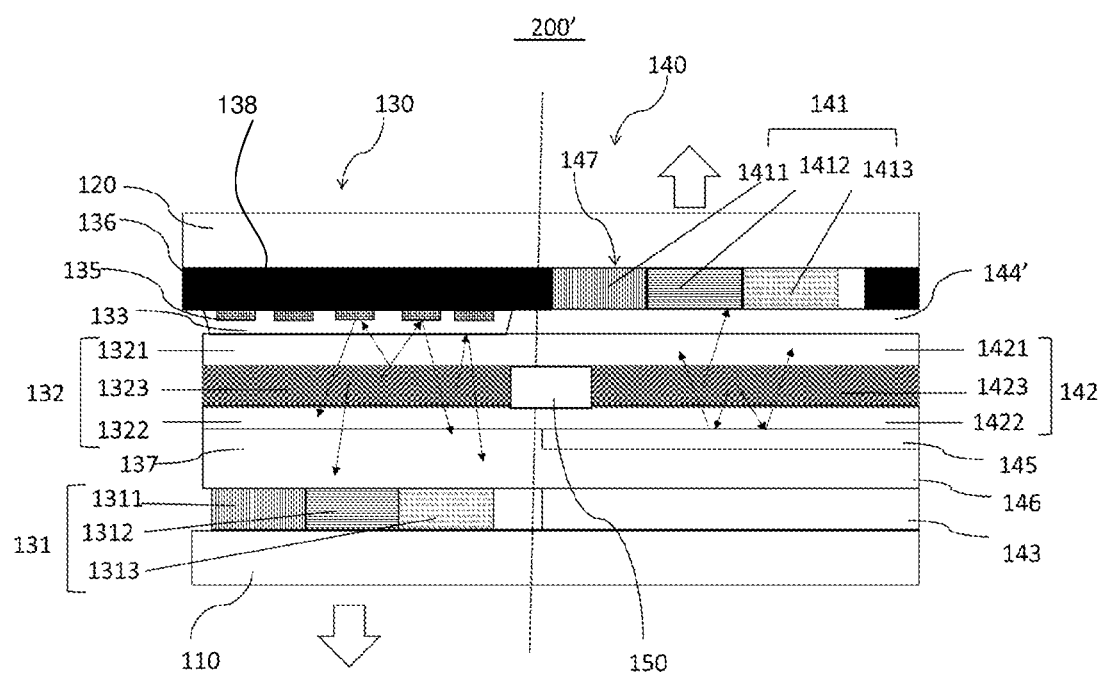
FIG. 3 illustrates a structural cross-sectional view of an OLED double-sided display panel according to some embodiments of the present disclosure.

FIG. 3 shows a schematic structural view of an OLED double-sided display panel according to some embodiments of the present disclosure. The structure of the OLED double-sided display panel 200' is substantially the same as that of the OLED double-sided display panel 200 as shown in FIG. 2. Components common to the two structures will not be repeated below, but for sake of brevity, they are denoted by the same reference numerals.

The first display unit 130 of the OLED double-sided display panel 200' no longer includes the spacer layer 134, so that the first reflective layer 135 is disposed directly on the black matrix 136. The conductive contact layer 133 is disposed on the first reflective layer 135 to surround or cover the first reflective layer 135. In other words, at least a portion of the conductive contact layer 133 (e.g., both sides in the drawing) contacts the black matrix 136. As shown in FIG. 3, an orthographic projection of the first reflective layer 135 on the second substrate 120 falls within an orthographic projection of the conductive contact layer 133 on the second substrate 120, a surface of the first reflective layer 135 facing towards the second substrate 120 contacts the black matrix 136, and a part of a surface of the conductive contact layer 133 facing towards the second substrate 120 also contacts the black matrix 136.

In some embodiments, the first reflective layer 135 is made of a metal material. Thus, the first reflective layer 135 is also referred to as an auxiliary cathode metal layer. In some examples, the first reflective layer 135 includes a plurality of strips or a plurality of dots made of an opaque metal material; or the first reflective layer 135 includes a single layer made of an opaque metal material. For example, as shown in FIG. 3, the first reflective layer 135 includes a plurality of strips made of an opaque metal material; as shown in FIG. 5, the first reflective layer 135 includes a single layer made of an opaque metal material.

Figure 5:
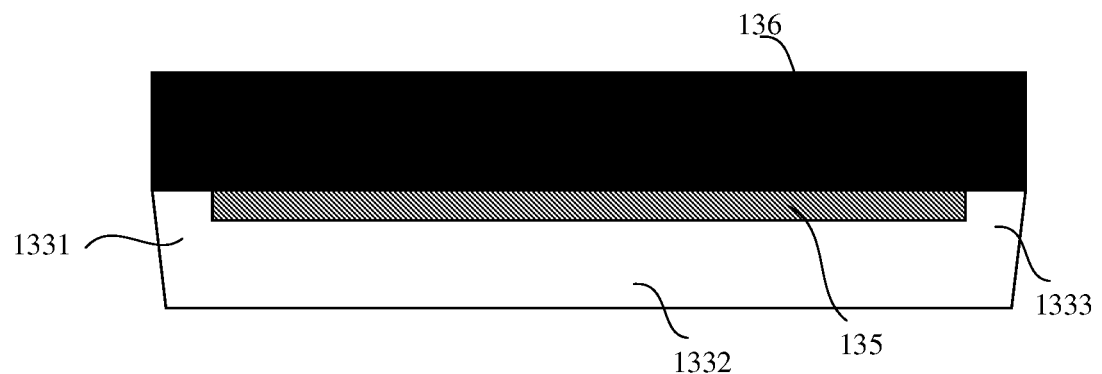
FIG. 5 is a partial enlarged view of an OLED double-sided display panel according to some embodiments of the present disclosure, in which positional relationships among a conductive contact layer, a first reflective layer and a black matrix are shown.

In some embodiments, referring to FIG. 3 and FIG. 5, the conductive contact layer 133 includes a first side portion 1331, a second side portion 1333 and a middle portion 1332, the first side portion 1331 and the second side portion 1333 are located on two opposite sides of the conductive contact layer 133, respectively, and the middle portion 1332 is located between the first side portion 1331 and the second side portion 1333. For example, in the embodiment shown in FIG. 5, the conductive contact layer 133 has substantially a "U"-shape cross section. The first reflective layer 135 is located in a space formed between the conductive contact layer 133 and the black matrix 136. The first side portion 1331 and the second side portion 1333 both contact the black matrix 136, and the middle portion 1332 contacts the first reflective layer 135. An orthographic projection of the first reflective layer 135 on the second substrate 120 falls within an orthographic projection of the middle portion 1332 on the second substrate 120, and the orthographic projection of the first reflective layer 135 on the second substrate 120 does not overlap with an orthographic projection of each of the first side portion 1331 and the second side portion 1333 on the second substrate 120. Further, a dimension of the middle portion 1332 in the direction from the first luminescent layer 1323 to the black matrix 136 (the dimension is a thickness of the middle portion 1332 according to an orientation in FIG. 3 or FIG. 5) is less than a dimension of each of the first side portion 1331 and the second side portion 1333 in the direction from the first luminescent layer 1323 to the black matrix 136 (the dimension is a thickness of the first side portion 1331 or the second side portion 1333 according to the orientation in FIG. 3 or FIG. 5).

It is to be appreciated that such an arrangement may further reduce a distance between the first reflective layer 135 and the first OLED element layer 132. Correspondingly, in the second display unit 140, a thin film encapsulation layer 144' is disposed between the second color filter layer 141 and the second OLED element layer 142. In some embodiments, the thin film encapsulation layer 144' may have a smaller thickness than the sealant layer 144, for example, which is made of glass.

In such an arrangement, the spacer layer 134 for planarization may be omitted, thereby further reducing the cell gap of the double-sided display panel, and reducing light absorption by the black matrix 136, so that the first display unit 130 has a high luminous efficiency.

In some embodiments, the thin film encapsulation layer 144' is included in the second display unit 140, so that the cell gap of the OLED double-sided display panel may be small. In other words, the thin film encapsulation layer itself may be made to have a smaller thickness than the sealant layer made of the transparent dry encapsulant.

Such an arrangement may further reduce the distance between the first reflective layer and the first OLED element layer, so that the luminous efficiency is high and the cell gap is at least partially reduced so as to increase the aperture ratio.

Some embodiments of the present disclosure provide a method for manufacturing an OLED double-sided display panel, as shown in FIGS. 1A-3, including the following steps:

providing a first substrate 10, 110 and a second substrate 20, 120 which are opposite to each other;

forming a black matrix 36, 136 on a surface of the second substrate 20, 120;

forming a first OLED luminescent layer 323, 1323 and a second OLED luminescent layer 423, 1423 between the first substrate 10, 110 and the second substrate 20, 120, and forming a transparent electrode 321, 1321 on a side of the first OLED luminescent layer 323, 1323 facing away from the first substrate;

forming a first reflective layer 35, 135 and a conductive contact layer 33, 133 on a side of the black matrix 36, 136 facing away from the second substrate 20, 120;

wherein a first display unit 30, 130 and a second display unit 40, 140 are arranged between the first substrate 10, 110 and the second substrate 20, 120, so that the first display unit 30, 130 is opposite to the light shielding region 38, 138 of the black matrix 36, 136 and the second display unit 40, 140 is opposite to the opening region 47, 147 of the black matrix 36, 136.

In this way, light emitted from the first OLED luminescent layer 323, 1323 is reflected by the first reflective layer 35, 135 and emitted out through the first substrate 10, 110, and light emitted from the second OLED luminescent layers 423, 1423 passes through the opening region 47, 147 of the black matrix 36, 136 and is emitted through the second substrate 20, 120.

In some embodiments, as shown in FIG. 1B and FIG. 1C, the method further includes: sequentially forming the first reflective layer 35, the spacer layer 34 on a portion of the first reflective layer 35, and the conductive contact layer 33 covering the spacer layer 34, on the black matrix 36. The conductive contact layer 33 is pressed together with a transparent electrode (for example, one of the transparent anode 322 and the transparent cathode 321) on the first OLED luminescent layer 323 through a pressing process so as to electrically connect the first reflective layer 35 with the transparent electrode (i.e., the transparent cathode 321 as shown). In addition, in some embodiments, a space between the transparent electrode (i.e., the transparent cathode 421 as shown) and the color filter layer 41 located in the opening region 37 of the black matrix 36 may be encapsulated by the sealant layer 44.

In some embodiments, as shown in FIG. 2, the method further includes: sequentially forming the spacer layer 134, the first reflective layer 135 on the spacer layer 134, and the conductive contact layer 133 covering both the spacer layer 134 and the first reflective layer 135, on the black matrix 136. The conductive contact layer 133 is pressed together with a transparent electrode (for example, one of the transparent anode 1322 and the transparent cathode 1321) on the first OLED luminescent layer 1323 through a pressing process so as to electrically connect the first reflective layer 135 with the transparent electrode. In some embodiments, a space between the transparent electrode 1421 and the color filter layer 141 located in the opening region 137 of the black matrix 136 may be encapsulated by the sealant layer 144.

In some other embodiments, as shown in FIG. 3, the method further includes: sequentially forming the first reflective layer 135 and the conductive contact layer 133 covering the first reflective layer 135, on the black matrix 136. The conductive contact layer 133 is pressed together with a transparent electrode (for example, one of the transparent anode 1322 and the transparent cathode 1321) on the first OLED luminescent layer 1323 through a pressing process so as to electrically connect the first reflective layer 135 with the transparent electrode. In some embodiments, a space between the transparent electrode 1421 and the color filter layer 141 located in the opening region 137 of the black matrix 136 may be encapsulated by the thin film encapsulation layer 144'.

In addition, in some embodiments, the first OLED luminescent layer 323, 1323 and the second OLED luminescent layer 423, 1423 are an OLED luminescent layer manufactured by the same patterning process. For example, they may be the same one OLED luminescent layer, or they may be different OLED luminescent layers having the same structure.

In another embodiment, the first reflective layer 35 may also be made of a plurality of strips or dots from a metal material, for example, the plurality of strips or dots may be distributed in a pattern such as a dot matrix or the like.

Since other structures and arrangements of the OLED double-sided display panel in the present disclosure have been discussed in detail above, they are not repeated here.

The foregoing embodiments have described the double-sided display panel and the method for manufacturing the double-sided display panel according to the present disclosure with reference to an OLED display panel. However, it should be noted that the double-sided display structure according to the present disclosure is also applicable to a QLED (quantum dot light emitting diode) display panel. In the similar way, a QLED double-sided display panel and a method for manufacturing a QLED double-sided display panel may be constructed, which will not be described herein.

The above-described embodiments are merely illustrative of the principles and construction of the present disclosure, and are not intended to limit the present disclosure, and those skilled in the art will understand that any changes and improvements may be made to the present disclosure without departing from the general concept of the present disclosure. Therefore, the scope of the disclosure should be defined by the claims of the present disclosure.

What is claimed is:

1. A double-sided display panel comprising:
a first substrate;
a second substrate opposite to the first substrate;
a first display unit between the first substrate and the second substrate, the first display unit comprising a first luminescent layer, a first reflective layer, a transparent electrode between the first luminescent layer and the first reflective layer, and a conductive contact layer between the transparent electrode and the first reflective layer, wherein the first reflective layer is closer to the second substrate than the first luminescent layer, at least a part of light emitted from the first luminescent layer is reflected by the first reflective layer and then emitted out through the first substrate; and
a second display unit between the first substrate and the second substrate, the second display unit comprising a second luminescent layer, wherein light emitted from the second luminescent layer is emitted out through the second substrate,
wherein the conductive contact layer electrically connects the transparent electrode with the first reflective layer.

2. The double-sided display panel of claim 1, wherein the double-sided display panel further comprises a black matrix on a side of the second substrate facing towards the first substrate;
wherein the transparent electrode, the conductive contact layer and the first reflective layer are sequentially disposed between the black matrix and the first luminescent layer in a direction from the first luminescent layer to the black matrix; and
wherein at least a portion of the conductive contact layer contacts the black matrix layer.

3. The double-sided display panel of claim 2, wherein the conductive contact layer comprises a first side portion, a second side portion and a middle portion, the first side portion and the second side portion being located on two opposite sides of the conductive contact layer, respectively, the middle portion being between the first side portion and the second side portion;
wherein the first side portion and the second side portion both contact the black matrix, an orthographic projection of the first reflective layer on the second substrate falls within an orthographic projection of the middle portion on the second substrate, and the orthographic projection of the first reflective layer on the second substrate does not overlap with an orthographic projection of each of the first side portion and the second side portion on the second substrate; and
wherein a dimension of the middle portion in the direction from the first luminescent layer to the black matrix is less than a dimension of each of the first side portion and the second side portion in the direction from the first luminescent layer to the black matrix.

4. The double-sided display panel of claim 2, wherein the first reflective layer contacts a surface of the black matrix facing towards the first substrate, and an orthographic projection of the first reflective layer on the second substrate falls within an orthographic projection of the conductive contact layer on the second substrate.

5. The double-sided display panel of claim 1, wherein the double-sided display panel further comprises a black matrix on a side of the second substrate facing towards the first substrate;
wherein the first display unit further comprises a spacer layer;
wherein the transparent electrode, the conductive contact layer, the first reflective layer and the spacer layer are sequentially disposed between the black matrix and the first luminescent layer in a direction from the first luminescent layer to the black matrix; and
wherein at least a portion of the conductive contact layer contacts the black matrix.

6. The double-sided display panel of claim 5, wherein the conductive contact layer comprises a first side portion, a second side portion and a middle portion, the first side portion and the second side portion being located on two opposite sides of the conductive contact layer, respectively, the middle portion being between the first side portion and the second side portion;
wherein the first side portion and the second side portion both contact the black matrix, and the middle portion contacts the first reflective layer or the spacer layer; and
wherein a dimension of the middle portion in the direction from the first luminescent layer to the black matrix is less than a dimension of each of the first side portion and the second side portion in the direction from the first luminescent layer to the black matrix.

7. The double-sided display panel of claim 5, wherein the spacer layer contacts a surface of the black matrix facing towards the first substrate, and the first reflective layer is located on a surface of the spacer layer facing away from the black matrix.

8. The double-sided display panel of claim 7, wherein an orthographic projection of the first reflective layer on the second substrate falls within an orthographic projection of the spacer layer on the second substrate.

9. The double-sided display panel of claim 8, wherein the orthographic projection of each of the first reflective layer and the spacer layer on the second substrate falls within an orthographic projection of the conductive contact layer on the second substrate.

10. The double-sided display panel of claim 1, wherein the double-sided display panel further comprises a black matrix on a side of the second substrate facing towards the first substrate, the black matrix comprises a light shielding region and an opening region, the first display unit is between the light shielding region of the black matrix and the first substrate, and the second display unit is between the opening region of the black matrix and the first substrate.

11. The double-sided display panel of claim 10, wherein the second display unit further comprises a second color filter layer, and the second color filter layer is located in the opening region of the black matrix.

12. The double-sided display panel of claim 11, wherein the second display unit further comprises a thin film encapsulation layer or a sealant layer between the second color filter layer and the second luminescent layer.

13. The double-sided display panel of claim 1, wherein the second display unit further comprises an array circuit layer between the first substrate and the second luminescent layer, the array circuit layer being configured to control light emission of both the first display unit and the second display unit.

14. The double-sided display panel of claim 1, wherein the first display unit further comprises a first color filter layer between the first luminescent layer and the first substrate; and/or the second display unit further comprises a second color filter layer between the second luminescent layer and the second substrate.

15. The double-sided display panel of claim 1, wherein the first reflective layer is an auxiliary electrode metal layer made of a metal material.

16. The double-sided display panel of claim 15, wherein the first reflective layer comprises a plurality of strips or a plurality of dots made of an opaque metal material; or the first reflective layer comprises a single layer made of an opaque metal material.

17. The double-sided display panel of claim 1, wherein the second display unit further comprises a second reflective layer between the first substrate and the second luminescent layer.

18. A method for manufacturing a double-sided display panel comprising:
   providing a first substrate and a second substrate which are opposite to each other;
   forming a first luminescent layer and a second luminescent layer between the first substrate and the second substrate, and forming a transparent electrode on a side of the first luminescent layer facing away from the first substrate; and
   forming a first reflective layer and a conductive contact layer between the first substrate and the second substrate,
   wherein a first display unit and a second display unit are arranged between the first substrate and the second substrate;
   wherein the first display unit comprises the first luminescent layer, the transparent electrode, the conductive contact layer and the first reflective layer, so that at least a part of light emitted from the first luminescent layer is reflected by the first reflective layer and then emitted out through the first substrate;
   wherein the second display unit comprises the second luminescent layer, so that light emitted from the second luminescent layer is emitted out through the second substrate; and
   wherein the conductive contact layer is between the transparent electrode and the first reflective layer so as to electrically connect the transparent electrode with the first reflective layer.

19. The method of claim 18, wherein before the step of forming the first reflective layer and the conductive contact layer between the first substrate and the second substrate, the method further comprises: forming a black matrix on the second substrate; and
   wherein the step of forming the first reflective layer and the conductive contact layer between the first substrate and the second substrate comprises:
      forming the first reflective layer on the black matrix, the first reflective layer contacting a surface of the black matrix facing away from the second substrate; and
      forming the conductive contact layer on a side of the first reflective layer facing away from the second substrate, the conductive contact layer covering the first reflective layer and at least a portion of the conductive contact layer contacting the black matrix.

20. The method of claim 18, further comprising: forming a black matrix on the second substrate before the step of forming the first reflective layer and the conductive contact layer between the first substrate and the second substrate; and forming a spacer layer on the black matrix, the spacer layer contacting a surface of the black matrix facing away from the second substrate,
   wherein the step of forming the first reflective layer and the conductive contact layer between the first substrate and the second substrate comprises:
      forming the first reflective layer on a surface of the spacer layer facing away from the black matrix; and
      forming the conductive contact layer on a side of the first reflective layer facing away from the second substrate, the conductive contact layer covering both the first reflective layer and the spacer layer and at least a portion of the conductive contact layer contacting the black matrix.

* * * * *